US006151532A

United States Patent [19]
Barone et al.

[11] Patent Number: 6,151,532
[45] Date of Patent: Nov. 21, 2000

[54] METHOD AND APPARATUS FOR PREDICTING PLASMA-PROCESS SURFACE PROFILES

[75] Inventors: Maria E. Barone, Sunnyvale; Richard A. Gottscho, Pleasanton; Vahid Vahedi, Albany, all of Calif.

[73] Assignee: Lam Research Corporation, Fremont, Calif.

[21] Appl. No.: 09/033,997

[22] Filed: Mar. 3, 1998

[51] Int. Cl.[7] .................................................. G06F 19/00
[52] U.S. Cl. .............................. 700/121; 700/46; 700/47; 700/108; 700/109; 700/117; 700/123; 438/729; 324/460; 324/464; 204/192.13; 204/192.33
[58] Field of Search .................................... 700/32, 34, 46, 700/47, 48, 108, 109, 121, 117, 123, 28, 29, 31, 44; 438/729; 324/460, 464; 204/192.13, 192.33

[56] References Cited

U.S. PATENT DOCUMENTS

| 4,663,513 | 5/1987 | Webber | 219/121 |
|---|---|---|---|
| 5,107,105 | 4/1992 | Isobe | 250/225 |
| 5,225,740 | 7/1993 | Ohkawa | 315/111.41 |
| 5,270,222 | 12/1993 | Moslehi | 437/8 |
| 5,399,229 | 3/1995 | Stefani et al. | 156/626 |
| 5,422,139 | 6/1995 | Fischer | 427/248.1 |
| 5,654,903 | 8/1997 | Reitman et al. | 364/551.01 |
| 5,679,599 | 10/1997 | Mehta | 437/69 |
| 5,711,843 | 1/1998 | Jahns | 156/345 |
| 5,737,496 | 4/1998 | Frye et al. | 395/23 |
| 5,861,752 | 1/1999 | Klick | 324/464 |
| 5,869,402 | 2/1999 | Harafuji et al. | 438/729 |
| 5,933,345 | 8/1999 | Martin et al. | 700/29 |
| 5,949,678 | 9/1999 | Wold et al. | 700/29 |
| 5,963,710 | 10/1999 | Masumoto | 700/31 |

FOREIGN PATENT DOCUMENTS 0602855   6/1994   European Pat. Off. .

OTHER PUBLICATIONS

Reitman, E. A.: "Neural Networks in Plasma Processing", Jan. 1, 1996, Journal of Vacuum Science and Technology: Part B, vol. 14, NR. 1, pp. 504–510.

Moyne, J. R., et al.: "Adaptive Extensions to a Multibranch Run–to–Run Controller for Plasma Etching", May 1, 1995, Journal of Vacuum Science and Technology: Part A, vol. 13, NR. 3, Part 2, pp. 1787–1791.

Vivek, K. Singh, et al.: "The Effect of Surface Transport on the Evolution of Film Microstructure in Plasma Etching and Deposition", Microelectronic Engineering, vol. 35, 1997, pp. 37–40.

S. Hamaguchi, *"Mathematical Methods for Thin Film Deposition Simulations"*, vol. 22, pp. 81–115, 1996.

S. Hamaguchi et al., *"Liner Conformality in ionized Magentron Sputter Metal Deposition Processes"*, pp. 2603–2608, 1996.

Guru Thallikar et al., *"Experimental and Simulation Studies of Thermal Flow of Borophosphosilicate and Phosphilicate Glasses"*, pp. 1875–1878, 1995.

(List continued on next page.)

*Primary Examiner*—Paul P. Gordon
*Assistant Examiner*—Ramesh Patel
*Attorney, Agent, or Firm*—Cesari and McKenna, LLP

[57] ABSTRACT

The invention provides a method for predicting a process surface profile that a given plasma process will create on a process substrate. The prediction is based on a test surface profile, the experimental outcome of a test process which is in general different from the plasma process of interest. In another aspect, the invention provides a technique for defining a plasma process that will produce a desired surface profile. Thus, in related aspects, the invention also provides apparatus for predicting a process surface profile and determining process values, a method of configuring a plasma reactor, a method of making semiconductor devices requiring limited empirical calibration, and a device made according to the method.

28 Claims, 3 Drawing Sheets

OTHER PUBLICATIONS

Jane P. Chang et al., "*Plasma–Surface Kinetics and Feature Profile Evolution in Chlorine Etching of Polysilicon*".

V. Vahedi et al., "*Capacitive RF Discharges Modelled by Particle–in–Cell Monte Carlo Simulation. II: Comparisons with Laboratory Measurements of Electron Energy Distribution Functions*", pp. 273–278, 1993.

Maria E. Barone et al., "*Molecular Dynamics Simulations of Plasma–Surface Chemistry*", pp. 187–192, 1996.

A.D. Bailey et al., "*Scaling of Si and GaAs Etch Rates with Aspect Ratio, Feature Width, and Substrate Temperature*", pp. 92–104, 1995.

Joseph S. Han et al., "*Profile Modeling of High Desity Plasma Oxide Etching*", pp. 1893–1899, 1995.

Richard A. Gottscho et al., "*Microscopic Uniformity in Plasma Etching*", pp. 2133–2147, 1992.

V. Vahedi et al., "*Capacitive RF Discharges Modelled by Particle–in–Cell Monte Carlo simulation. I: Analysis of Numberical Techniques*", pp. 261–272, 1993.

P. Li et al., "*Simulation and Experimental Analysis of Planarization Using a Multistep Sputter/Sputter Etch Process*", pp. 530–532, 1994.

Huang Liao et al., "*Computer Simulations of Borophosphosilicate Film Thermal Flow*", pp. 527–529, 1994.

Huang Liao et al., "*Simulations of Metal Thin Film Thermal Flow Processes*", pp. 2615–2622, 1996.

METHOD AND APPARATUS FOR PREDICTING PLASMA-PROCESS SURFACE PROFILES

FIELD OF THE INVENTION

This invention relates to plasma processing of semiconductor devices. In particular, this invention provides method and apparatus for predicting the surface profile that a given plasma process will create.

BACKGROUND OF THE INVENTION

The manufacture of a semiconductor device routinely entails a sequence of processes in each of which a substrate is exposed to a partially ionized gaseous medium in order to effect deposition of material onto the substrate or removal of material therefrom. Such a plasma process is defined by an ensemble of macroscopic input parameters—including, for example, power, temperature, pressure, inlet gas composition, substrate material, duration of exposure—very one of which affects the resulting profile on the substrate. Traditionally, a suite of values of these input parameters suitable for creating a given set of device features has been determined by trial and error. Development of a single process by this empirical approach is costly and time-consuming, requiring treatment of several patterned wafers and subsequent study of the resulting profiles by scanning electron microscopy. Because of the unpredictable way a small change in one input parameter may affect the profile, any modification of the layout—for example in device dimension, pattern density on the wafer, change in total open area—from one application to another has often necessitated redevelopment of the process, with the attendant outlay of resources.

Recent advances in device fabrication technology are rendering this approach even more onerous. Decreasing feature sizes demand tighter tolerances on feature dimensions and morphologies, so that the number of trials required to optimize a given process is increasing. The acceleration of wafer diameter growth and the complete redesign of the process involved with an incremental change in diameter have increased the number of times this empirical process must be repeated. The increasing use of devices tailor-made to a specific application also increases the amount of development and optimization activity required.

An alternative, computational approach would derive input parameters from a complete physical description of a plasma process including a plasma model for describing the coupling between the macroscopic input parameters and the macroscopic fluxes, concentrations and energy distributions of the various species in the plasma; and a profile simulator for atomistically determining from the macroscopic fluxes the resulting etch or deposition rate along the wafer surface and calculating the profile evolution therefrom. Ideally, such a physical description of plasma etching and deposition processes would enable the ab initio selection of the macroscopic input parameters appropriate for generating a desired profile on the substrate, eliminating the need for expensive and time-consuming test sequences.

Research in this field has done much to elucidate mechanisms at work in plasma processes, and thus has contributed scaling laws that could frame a physical description. However, notwithstanding the availability of computational means sufficiently powerful to perform the necessary calculations based on known scaling laws, the implementation of such an ab initio approach has been limited by lack of data. For example, the manner in which the values of some coefficients in these laws depend on the particulars of a given process has been unknown as yet. In past investigations, determination of the value of such a scaling coefficient consistent with a plasma process defined by a given set of input parameters has typically been done by comparing a finished profile, created by applying that process, with a simulated profile including one or more of these coefficients as adjustable parameters. Such hindsight evaluation may promote understanding a given coefficient's role in a scaling law, but it has not afforded the ability to predict profile evolution for any process defined by a set of input parameters differing from the set used in the experimental process used to derive the value of that coefficient.

SUMMARY OF THE INVENTION

The invention enables prediction of a process surface profile that a plasma process of interest, defined by a set of process values of input parameters including input variables, will create on a process substrate. The prediction is based on a test surface profile, defined to be the experimental outcome of a test process defined by a set of test values of input parameters, including the input variables, such that at least one of the input parameter values defining the test process differs from the corresponding input parameter value defining the process of interest. (As used herein, the term "input variable" designates an input parameter whose value is free to vary within the context of a given application of the invention to a plasma process.) In another aspect, the invention provides a technique for determining, using a test surface profile, process values of input variables that will produce a desired surface profile. In this aspect, the test surface profile differs from the desired profile, or the value of some fixed input parameter defining the test process differs from the corresponding parameter value defining the process for producing the desired profile.

In related aspects, the invention also provides apparatus for predicting a process surface profile and determining process values, a method of configuring a plasma reactor, a method of making semiconductor devices requiring limited empirical calibration, and a device made according to the method.

The semi-empirical approach of the invention incorporates a calibration procedure that operates as follows. An initial mathematical surface profile model, formulated in terms of fixed input parameters, input variables and a plurality of coefficients of unknown values, is evaluated at the test values of the input variables to generate a quantitative approximate prediction of the profile created by the test process. The values of the unknown coefficients are then optimized to minimize the difference, as determined by a quantitative comparison, between the test surface profile and approximate profile prediction. By substitution of these optimum values for the unknown coefficients in the initial surface profile model, the calibration provides a final mathematical model having the input variables as unknowns.

The calibrated final mathematical model can be used in any one of several aspects of the invention. Inserting process values of interest into the final mathematical model enables prediction of the process surface profile that would be created by applying to a process substrate the plasma process sequence defined by the process values. The process values used for this predictive function may be constant, corresponding to a single static process or may vary over time, for example representing a multistep process. Alternatively, process values appropriate for creating a desired surface profile are derived from the final mathematical profile model and the desired profile.

The calibrated final mathematical model is also useful in formulating a new plasma process sequence using a different reactor design than that used to create an available test surface profile, or having one or more process values sufficiently different from the corresponding test value to place the new sequence in a regime for which the test process has limited predictive power; in such cases, input variable process values derived using the calibrated coefficients may serve as a sensible starting point for empirical optimization, so that the number of wafers that must be spent in finding the ultimate process sequence is reduced.

Thus by using data available from direct measurement of a limited number of laboratory-generated microstructures, the invention provides powerful techniques for plasma process device manufacture that incorporate significantly less experimentation than fully empirical methods, yet do not require the body of fundamental data needed for a complete computational simulation.

The semi-empirical approach of the invention is not limited to any particular macroscopic physical description of the surface profile or underlying plasma model or profile simulator. The mathematical models may incorporate scaling laws derived from basic plasma physics and chemistry, numerical simulations or experiment. In general, the plasma model is configured to return fluxes, energy and angular distributions arriving at the substrate surface for species of interest, based on parameters related to the function of the reactor. The plasma model may entail a complete plasma simulation tool with all known cross sections for the gas-phase chemistry and plasma surface interactions, or merely a look-up table of experimentally measured fluxes and observed trends. In either approach, the model generally includes at least one coefficient of unknown value that is determined by the calibration of the invention. Individual coefficients of unknown value in the plasma model provide reference magnitudes or characterize the coupling between input parameters and aspects of plasma behavior, and thus they collectively describe the physical properties of the medium generated by the plasma process. Alternately, the plasma model may be eliminated altogether as a distinct module, the profile simulator treating the fluxes as adjustable coefficients of unknown value to be determined by the calibration.

The profile simulator preferably, for accuracy and versatility, calculates the movement of each point of the substrate surface. An appropriate profile simulator in general includes a local transport module for calculating local fluxes arriving at each point of the substrate surface, a site balance model for calculating local rates of etching and deposition, and a surface advancement algorithm for translating these mechanisms into net surface movement. In a preferred embodiment, the profile simulator derives the local fluxes from the macroscopic parameters provided by the plasma model using Monte Carlo methods; a Langmuir-type model describes the site balance; and the surface advancement algorithm incorporates a shock-front-tracking approach. Generally speaking, each of these three segments contributes coefficients of unknown value to be determined at calibration. The coefficients of unknown value in the profile simulator characterize couplings between the processing medium and the behavior of the substrate surface and thus collectively describe the substrate surface evolution.

In a preferred embodiment, the quantitative comparison of the calibration compares the test surface profile with the approximate prediction at each point along the substrate surface, and the local differences constitute a residual function. A multidimensional nonlinear least-squares technique, such as a modified Levenberg-Marquandt algorithm, is used to determine how each of the unknown coefficients affects the residual function and then to adjust the unknown coefficients so as to attempt to maximize some figure of merit and provide acceptable goodness of fit.

As used herein, the term "test profile" denotes all of the experimental profile data available for a given calibration and may include multiple snapshots, each taken after a different length of processing time but otherwise under the same process conditions as the other snapshots in the profile. Or, more generally, the snapshots in a given test profile may be generated using test processes varying in aspects other than processing time. Also, this description of the invention emphasizes the general case of a plasma process defined by a plurality of input variables and mathematical surface profile models including a plurality of coefficients of unknown value. However, the invention also encompasses applications to treatment sequences having only one free input variable and/or mathematical models for which the value of only one coefficient is unknown.

BRIEF DESCRIPTION OF THE DRAWINGS

The invention description below refers to the accompanying drawings, of which.

DETAILED DESCRIPTION OF AN
ILLUSTRATIVE EMBODIMENT

Figure 1:
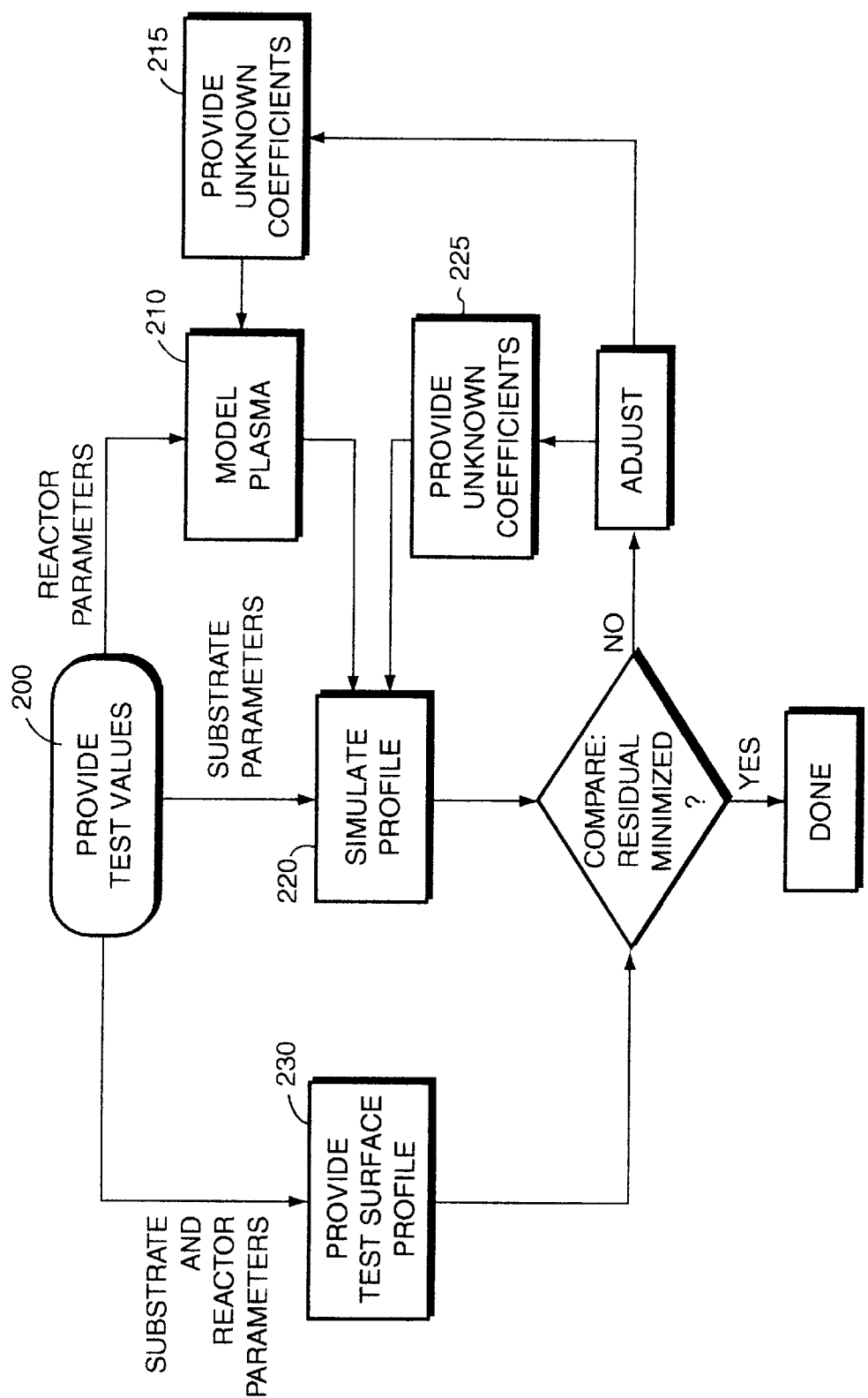
FIG. 1 is a flow chart illustrating the calibration sequence for the method of the invention.

The general procedure for performing the calibration of the invention based on a given empirical test process is illustrated in FIG. 1. In a first step 200, test values of the input parameters are selected. The input parameters include descriptors of the pre-processing state of the substrate ("substrate parameters") and quantities defining the operation of a given plasma reactor during the test process ("reaction parameters"). The substrate parameters may include, for example, gross dimensions of the substrate, the distribution and dimensions of any features on the surface, and the substrate composition. The reaction parameters may include any of power levels, temperature, pressure, inlet gas composition and length of time the substrate is treated by the plasma process.

The test values of the reaction variables and fixed reaction parameters are used in step 210, in which a plasma model, containing a mathematical description of the plasma in terms of the reaction parameters for the reactor of interest and coefficients of unknown value, operates to approximately determine the macroscopic properties of the plasma generated by the test process. The approximation carried out in step 210 is based on rough preliminary values of the plasma model coefficients of unknown value, provided in step 215.

In step 220 a profile simulator, containing a mathematical model of the time evolution of the substrate surface profile in terms of the substrate parameters, the macroscopic plasma properties and coefficients of unknown value, uses the results of step 210 and the substrate parameters provided in step 200 to approximately predict the effect of the test process on the substrate surface profile. The approximation carried out in step 220 is based on rough preliminary values of the profile simulator coefficients of unknown value, provided in step 225. Thus, the cumulative output of steps 200 through 220, particularly of the operation of the plasma model in step 210 and the profile simulator in step 220, which together comprise an initial mathematical surface profile model, is a quantitative but approximate prediction of the profile created by the test process.

In step 230 the test values of the input parameters provided in step 200 are used to provide a test surface profile, created experimentally by subjecting a test substrate to a test process, in the reactor of interest, defined by the test values of the input parameters. This test surface profile is quantitatively compared in step 240 with the quantitative approximate prediction resulting from step 220. The difference between the test surface profile and the approximate prediction is evaluated according to some criterion applied in step 240. In general, on the first pass, in which the approximate prediction is computed using preliminary values of unknown coefficients, the residual is not sufficiently small to satisfy the criterion, and the calibration procedure advances to step 250, in which the values of the unknown coefficients are adjusted so as to mitigate the residual. The adjusted values are then passed to the plasma model and/or the profile simulator through steps 215 and/or 225, for another iteration of the steps that render the approximate profile prediction and of the comparison in step 240. Iteration continues until the discrepancy between the test surface profile and the approximate prediction is adequately minimized.

Thus the iterative comparison of step 240 and coefficient adjustment of step 250 effect a calculation of optimum values of the coefficients of unknown value appearing in the initial mathematical surface profile model. After the calibration of the invention determines the coefficient values suitable for the mathematical surface profile model, the resulting final mathematical model can be used to account for the effect on a substrate of plasma process sequences differing from the test process in one or more process variable values, so long as the semi-empirical model properly accounts for factors such as loading and aspect ratio dependencies.

Preferably, the approximate profile prediction generated by the profile simulator comprises a series of frames, each corresponding to a regular time increment, in step 220 and the compare step 230 only compares frames of the approximate profile prediction that correspond to cumulative exposure times roughly equal to the time of the snapshots in the test surface profile. If the test profile includes multiple snapshots at different exposure times and/or at a different test value of one or more input parameters other than time, step 240 compares each test snapshot with the appropriate frame of the profile prediction and the system operates to minimize the residual over the entire pairwise comparison.

As will be evident to those skilled in the art, many configurations departing from the procedure shown in FIG. 1 fall within the scope of the invention. For example, the entire initial mathematical surface profile model may reside in a single module rather than being divided into distinct parts 210 and 220 to deal separately with phenomena acting over different length scales. Or, depending on the nature of the initial mathematical surface profile model and comparison algorithm used, insertion of the test values and preliminary coefficients into the initial mathematical surface profile model may be delayed until the comparison step.

In a preferred embodiment, the plasma model characterizes the species of interest only as belonging to a general class of actors, for example, as being either charged particles, and thus attracted to the substrate by any applied bias, or neutral species such as gas molecule and excited radicals. Physical models—for example, Maxwell's and Boltzmann's equations—underlying the functional dependence in terms of governing experimental input parameters of such plasma descriptors as particle fluxes, energy, and angular distributions are well known in the art. (See, e.g., Lieberman and Lichtenberg, *Principles of Plasma Discharges and Materials Processing,* John Wiley, 1994.) Much is known in the art about how these descriptors scale with the input parameters, based on such basic physical models in conjunction with experimental data. However, the absolute value of these fluxes or distributions is not known a priori for a given process. Any such coefficient in the model whose value is unknown is treated by the calibration as an adjustable parameter.

In general, the profile simulator includes a local transport model for calculating fluxes arriving at each point along the substrate surface, a site balance model for calculating the resulting local etch and deposition rates, and a surface advancement algorithm. In a preferred embodiment, a Monte Carlo approach is used for the local transport, for which information from atomic scale, simulation is appropriate.

Figure 2:
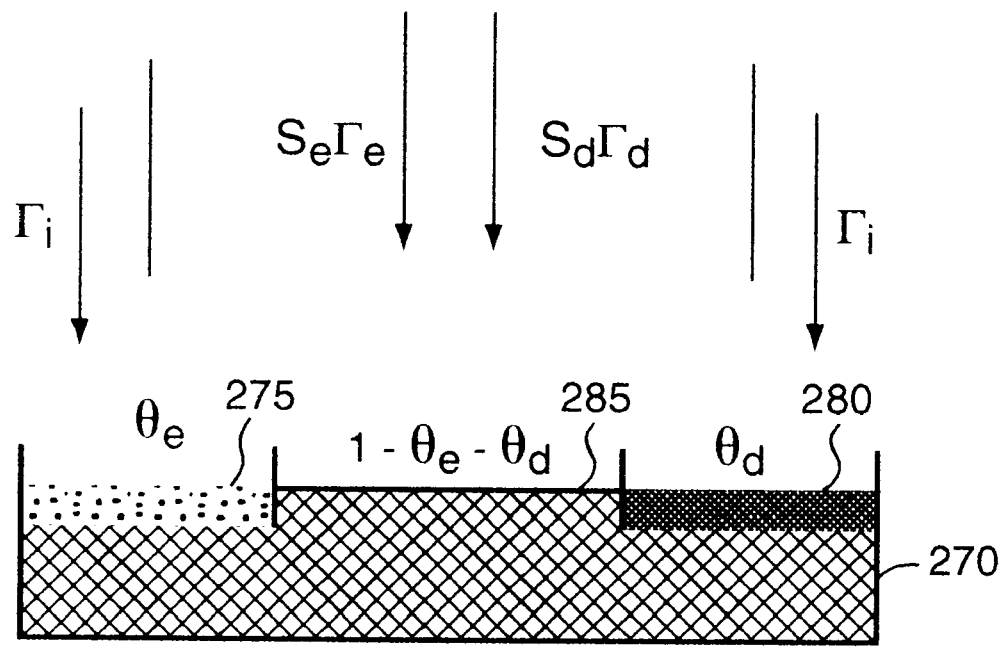
FIG. 2 schematically depicts surface kinetics according to the Langmuir model.

The site balance segment is preferably based on a Langmuir-type model of the kinetics of particle-surface interactions. The model characterizes species that remove material from the substrate as etchants and those that deposit material onto the substrate surface as inhibitors. With reference to FIG. 2, $\Gamma_e$ and $\Gamma_d$ respectively represent fluxes of etchants and inhibitors arriving at the surface of the substrate 270. Both etchants and inhibitors react with the surface when they encounter a vacant site. Etchant and inhibitor species react at the surface with respective open-field reaction coefficients of $S_e$ and $S_d$ to form etchant site 275 and inhibitor site 280. The overall occupancies of the substrate surface sites resulting from reactions with etchant and inhibitor species are represented respectively by fractions $\theta_e$ and $\theta_d$, with the number of vacant sites 285 being equal to $1-\theta_e-\theta_d$. Etch products can form and thermally desorb from the surface. Ions arriving at the surface, at flux $\Gamma_i$, can remove etchants that have reacted with the surface by physical sputtering and ion-enhanced etching; arriving ions can also remove inhibitors from the surface by physical sputtering. Taking into account these assumptions and mechanisms, the site balance, in the steady state, for the two types of occupied sites be expressed respectively as $$\sigma_e \frac{d\theta_e}{dt} = \Gamma_e S_e (1 - \theta_d - \theta_e) - \theta_e k_{sI} \Gamma_{is} - \theta_e k_{eI} \Gamma_{ie} - k_{th,e} \theta_e \cong 0$$

and $$\sigma_d \frac{d\theta_d}{dt} = \Gamma_d S_d (1 - \theta_d - \theta_e) - \theta_d k_{sI} \Gamma_{is} \cong 0,$$

wherein $k_{eI}$, $k_{sI}$, and $k_{th,e}$ are coefficients, generally of unknown value, associated with the ion-enhanced, physical sputtering and thermal etching mechanisms, respectively. The parameters $\Gamma_{ie}$ and $\Gamma_{is}$ are products of ion-enhanced etching and physical sputtering yields, respectively, with ion flux, integrated over incident ion energies greater than respective threshold energies, expressed respectively as $E_{th,i}$ and $E_{th,s}$, and over all angles, $$\Gamma_{ie} = \int_{E>E_{th,s}} \int Y_{ie}(\phi, E)\Gamma_i(\phi, E)d\phi dE$$

$$= \int_{E>E_{th,s}} dE\left(E^{\frac{1}{2}} - E_{th,e}^{\frac{1}{2}}\right) \int d\phi Y_e(\phi, E)\Gamma_i(\phi, E)$$

and $$\Gamma_{is} = \int_{E>E_{th,s}} \int Y_{is}(\phi, E)\Gamma_i(\phi, E)d\phi dE$$

$$= \int_{E>E_{th,s}} dE\left(E^{\frac{1}{2}} - E_{th,s}^{\frac{1}{2}}\right) \int d\phi Y_s(\phi, E)\Gamma_i(\phi, E).$$

We have assumed that the etch yields are products of angular fuctions and the square root of ion energy, which dependence has been observed experimentally. However, other scaling laws could be used instead. The yield functions only represent functional dependencies, the absolute magnitudes being lumped into the k's along with other constants.

Expressions for $\theta_e$ and $\theta_d$ can be derived from the steady-state site balance equations on each type of surface present on the substrate, for example the substrate top and trench bottoms and sidewalls. At each point on the surface, the etch rate can be written $$ER = k_{s2}\Gamma_{is} + \theta_e k_{e2}\Gamma_{ie} + k_{th}\Gamma_e - k_d\Gamma_d S_d(1-\theta_e).$$

The coefficients $k_{e2}$, $k_{s2}$, $k_d$ and $k_{th}$ are yield constants associated with physical sputtering, ion-enhanced etching, thermal etching and ion-induced deposition, respectively. Incorporating the expressions for $\theta_e$, $\theta_d$, $\Gamma_{is}$ and $\Gamma_{ie}$ renders the etch rate in terms of the plasma characteristics and the coefficients k, each of which is in principle an adjustable parameter that can be determined by the calibration.

It is also preferred to employ an analytic scheme for surface advancement so that the fine features can be resolved more accurately. One such schemes known in the art and capable of modeling fine feature aspects, such as sharp corners, is the method of characteristics, also known as shock-front-tracking algorithm. (See, e.g., S. Hamaguchi, "Modeling of Film Deposition for Microelectronic Applications", *Thin Films*, vol. 22, p. 81, S. Rossnagel, ed., Academic Press, San Diego, 1996). Another is the level set approach. (See, e.g., J. A. Sethian, *Level Set Methods: Evolving Interfaces in Geometry, Fluid Mechanics, Computer Vision, and Materials Science,* Cambridge University Press 1996.). The shock-front-tracking approach models the surface (i.e., the interface layer between vacuum and solid) as a collection of piecewise continuous line segments, for each of which a rate of movement is calculated. The possibility of each segment's advancing or receding along its normal independently of the movement of the other segments allows for multiple potential solutions for the resulting surface. In order to avoid multiple solutions, these analytic schemes model the points between the line segments as shocks (i.e., discontinuities in the slope), and properly track the movement of the shocks.

Figure 3:
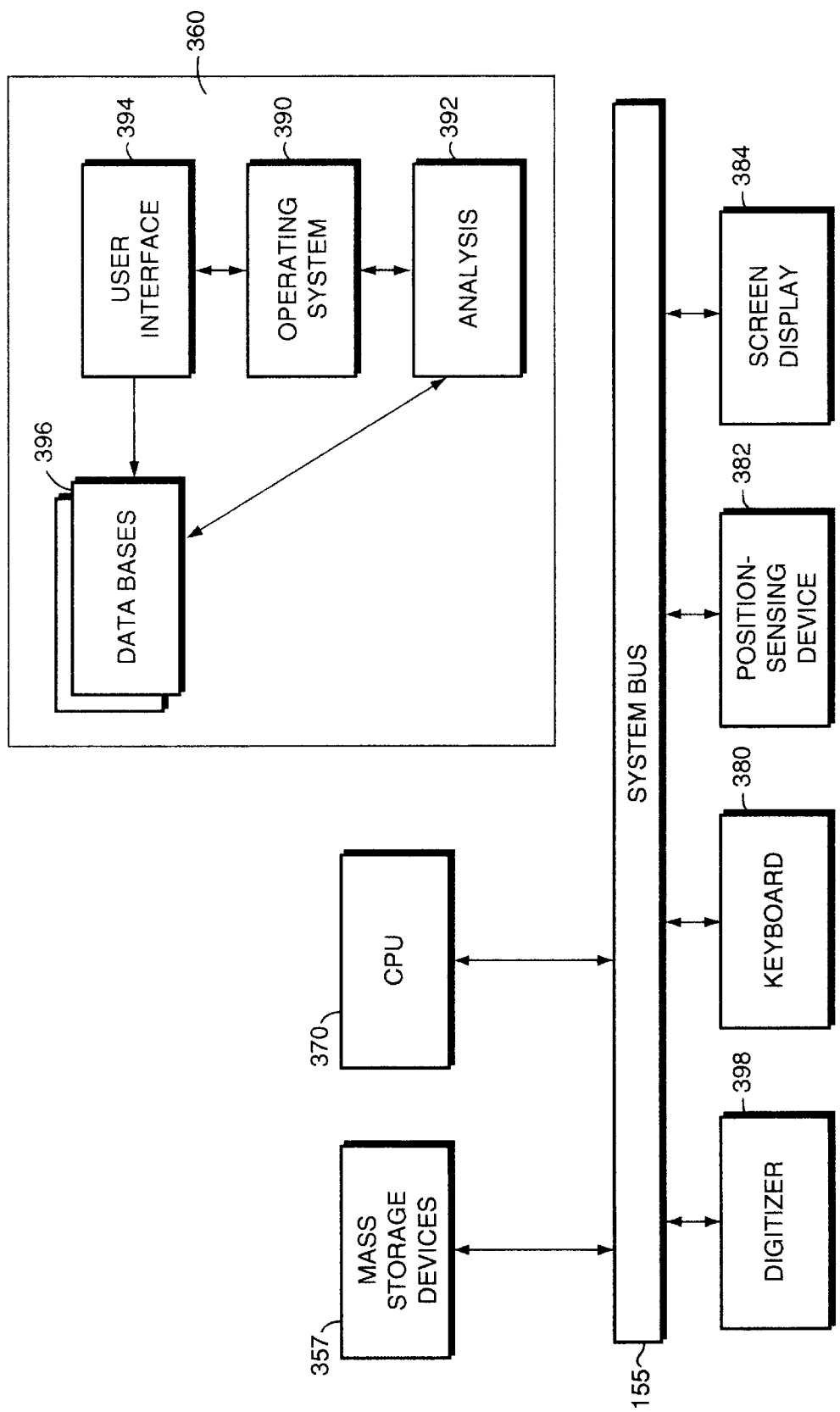
FIG. 3 schematically illustrates a representative hardware environment for the present invention.

Refer now to FIG. 3, which illustrates, in block-diagram form, a hardware system incorporating the invention. As indicated therein, the system includes a system bus 355, over which all system components communicate, a mass storage device (such as a hard disk or optical storage unit) 357 as well as a main system memory 360.

The operation of the illustrated system is directed by a central-processing unit ("CPU") 370. The user interacts with the system using a keyboard 380 and a position-sensing device (e.g., a mouse) 382. The output of either device can be used to designate information or select particular areas of a screen display 384 to direct functions to be performed by the system.

The main memory 360 contains a group of modules that control the operation of CPU 370 and its interaction with the other hardware components. An operating system 390 directs the execution of low-level, basic system functions such as memory allocation, file management and operation of mass storage devices 357. At a higher level, an analysis module 392, implemented as a series of stored instructions, directs execution of the primary functions performed by the invention, as discussed below. Instructions defining a user interface 394 allow straightforward interaction over screen display 384. User interface 394 generates words or graphical images on display 384 to prompt action by the user, and accepts user commands from keyboard 380 and/or position-sensing device 382. The main memory 360 also includes one or more databases 396, in general containing any of the test or process values of input parameters including input variables, the desired profile, the test surface profile and rough preliminary values of the coefficients of unknown value in the plasma model and profile simulator.

It must be understood that although the modules of main memory 360 have been described separately, this is for clarity of presentation only; so long as the system performs all necessary functions, it is immaterial how they are distributed within the system and its programming architecture.

The test surface profile is produced experimentally, as is well known in the art, by subjecting one or more test substrates to a test process in a plasma reactor and measuring the resulting surface profile using, for example, scanning electron microscopy. The desired and test surface profiles may be supplied to the hardware system in electronic format or as graphic hardcopy, in which case the image(s) is processed by a digitizer 398 before numerical comparison with the approximate prediction. The digitized profile is sent as bitstreams on the bus 355 to a database 396 of the main memory 360. The test surface profile may be stored in the mass storage device 357 as well as in databases 396.

As noted above, execution of the key tasks associated with the present invention is directed by analysis module 392, which governs the operation of CPU 370 and controls its interaction with main memory 360 in performing the steps necessary to provide a final mathematical surface profile model including calibrated optimum values of the unknown coefficients in the initial surface profile model; and, by further processing based on the final surface profile model and a desired surface profile, to determine process values of one or more input variables governing a plasma process sequence appropriate for creating the desired profile on a process substrate; or, by inserting process values of the input variables into the final mathematical model, to predictively calculate a process surface profile to be created on a process substrate by a plasma process sequence defined by the process values.

In particular, the hardware system depicted in FIG. 3 may be used to implement the calibration procedure illustrated by FIG. 1 as follows. The input variable test values selected in step 200, the test value of any fixed input parameter, the rough preliminary values of the unknown plasma model coefficients provided in step 215, the rough preliminary values of the unknown profile simulator coefficients provided in step 225, and the test surface profile created in step 230 and, as needed, the desired surface profile and/or process values of interest are provided to the database 396 so that they are available to the analysis module 392. Alternatively, the module 392 may retrieve any of the test values, rough preliminary values and test surface profile data from the mass storage device 357 or user interface 394 in response to a user command. Or, the rough preliminary values may be determined by the module 392, based on the input variable test values, according to a predetermined algorithm.

By executing the plasma modeling and profile simulation of steps 210 and 220, respectively, the module 392 establishes the initial mathematical surface model predicting the profile created by the test process. In step 240 the module 392 accesses the test surface profile and compares it with the initial mathematical surface profile model and evaluates the residual according to some predetermined criterion. If the residual is not sufficiently small, the analysis module 392 uses the results of the comparison to adjust the values of the unknown plasma model and profile simulator coefficients in step 250. The new values are retained in the database 396 for another iteration of the modeling/simulation and comparison steps. When the test surface profile and approximate prediction are sufficiently similar, the coefficients used in that final iteration are stored in the database 396 as the optimum values.

The analysis module uses these optimum values of the input variables for computation of process values, which can be loaded into a plasma reactor for production of a device including the desired profile, or for profile prediction as described above.

It will therefore be seen that the foregoing represents a highly extensible and advantageous approach to plasma processing of semiconductor devices. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed. For example, the various modules of the invention can be implemented on a general-purpose computer using appropriate software instructions, or as hardware circuits, or as mixed hardware-software combinations (wherein, for example, plasma modeling and profile simulation are performed by dedicated hardware components).

What is claimed is:

1. A method of determining a respective process value of at least one input variable governing a plasma process sequence for creating a desired surface profile on a process substrate, the method comprising the steps of:
   a. selecting a respective test value of the at least one input variable;
   b. performing on a test substrate, a test process defined by the respective test value, thereby creating a test surface profile;
   c. providing an initial surface profile model in terms of the at least one input variable and at least one unknown coefficient;
   d. generating an approximate profile prediction from the initial surface profile model and the respective test value of the at least one input variable;
   e. generating an indicator of difference between the test surface profile and the approximate profile prediction;
   f. generating a respective optimum value of the at least one unknown coefficient that minimizes the indicator of difference;
   g. modifing the initial surface profile model to include the at least one optimum value, thereby providing a final model in terms of the at least one input variable; and
   h. generating the respective process value of the at least one input variable from the final model and the desired surface profile.

2. The method of claim 1 wherein the at least one unknown coefficient comprises a plurality of unknown coefficients.

3. The method of claim 1 wherein the at least one input variable comprises a plurality of input variables, the approximate profile prediction being generated from the initial surface profile model and the respective test values of each of the plurality of input variables.

4. The method of claim 1 wherein the test surface profile comprises a plurality of snapshots, the approximate profile prediction including a frame corresponding to each snapshot, the step of generating an indicator of difference between the test surface profile and the approximate profile prediction including pairwise comparison of each snapshot with the respective corresponding frame.

5. The method of claim 1 wherein generating an approximate profile prediction includes using a respective rough preliminary value of the at least one unknown coefficient.

6. The method of claim 5 wherein generating a respective optimum value of the at least one unknown coefficient includes changing at least one of said at least one respective rough preliminary value of the at least one unknown coefficient and comparing the test surface profile and the approximate profile prediction incorporating the at least one changed value.

7. The method of claim 1 wherein the indicator of difference is generated by a multidimensional nonlinear least-squares technique.

8. A method of processing a process substrate to create a desired surface profile thereon, the process comprising the step of applying a plasma process to the process substrate, the plasma process being defined by the respective process value of the at least one input variable determined by the method of claim 1.

9. The method of claim 1 further comprising the step of applying a plasma process to the process substrate, the plasma process being defined by the respective process value of the at least one input variable.

10. A method of predictively calculating a process surface profile to be created on a process substrate by a plasma process sequence defined by a respective process value of at least one input variable, the method comprising the steps of:
   a. selecting a respective test value of the at least one input variable, at least one of said at least one respective test value being unequal to at least one of said at least one respective process value;
   b. performing, on a test substrate, a test process defined by the respective test value, thereby creating a test surface profile;
   c. providing an initial surface profile model in terms of the at least one input variable and at least one unknown coefficient;
   d. generating an approximate profile prediction from the initial surface profile model and the respective test value of the at least one input variable;
   e. generating an indicator of difference between the test surface profile and the approximate profile prediction;
   f. generating a respective optimum value of the at least one unknown coefficient that minimizes the indicator of difference;
   g. modifing the initial surface profile model to include the at least one optimum value, thereby providing a final model in terms of the at least one input variable; and h. introducing the respective process value of the at least one input variable into the final model, thereby forming a description of the process surface profile.

11. The method of claim 10 wherein the at least one unknown coefficient comprises a plurality of unknown coefficients.

12. The method of claim 10 wherein the at least one input variable comprises a plurality of input variables, the approximate profile prediction being generated from the initial surface profile model and the respective test values of each of the plurality of input variables.

13. The method of claim 10 wherein the test surface profile comprises a plurality of snapshots, the approximate profile description including a frame corresponding to each snapshot, the step of generating an indicator of difference between the test surface profile and the approximate profile description including pairwise comparison of each snapshot with the respective corresponding frame.

14. The method of claim 10 wherein generating an approximate profile description includes using a respective rough preliminary value of the at least one unknown coefficient.

15. The method of claim 14 wherein generating a respective optimum value of the at least one unknown coefficient includes changing at least one of said at least one respective rough preliminary value of the at least one unknown coefficient and comparing the test surface profile and the approximate profile prediction incorporating the at least one changed value.

16. The method of claim 10 wherein the indicator of difference is generated by a multidimensional nonlinear least-squares technique.

17. The method of claim 10 wherein the respective process value of the at least one input variable varies with time.

18. A method of configuring an apparatus for processing a process substrate according to a plasma process sequence defined by a respective process value of at least one input variable, the apparatus including a plasma reactor, the at least one input variable including at least one reaction variable, the method comprising the steps of:

a. selecting a respective test value of the at least one input variable;

b. performing, on a test substrate, a test process defined by the respective test value, thereby creating a test surface profile;

c. providing an initial surface profile model in terms of the at least one input variable and at least one unknown coefficient;

d. generating an approximate profile prediction from the initial surface profile model and the respective test value of the at least one input variable;

e. generating an indicator of difference between the test surface profile and the approximate profile prediction;

f. generating a respective optimum value of the at least one unknown coefficient that minimizes the indicator of difference;

g. modifying the initial surface profile model to include the at least one optimum value, thereby providing a final model in terms of the at least one input variable;

h. generating the respective process value of the at least one input variable from the final model and the desired surface profile; and i. configuring the reactor to process the process substrate according to the derived respective process value of the at least one reaction variable.

19. An apparatus for determining a respective process value of at least one input variable governing a plasma process sequence for creating a desired surface profile on a process substrate, the apparatus comprising:

a. a computer memory for storing the desired surface profile;

b. a computer memory for storing a test surface profile, created by performing a test process defined by a respective test value of the at least one input variable on a test substrate;

c. means for generating an initial surface profile model in terms of the at least one input variable and at least one unknown coefficient;

d. means for generating an approximate profile description from the initial surface profile model and the respective test value of the at least one input variable;

e. means for generating an indicator of difference between the test surface profile and the approximate profile prediction;

f. means for generating a respective optimum value of the at least one unknown coefficient that minimizes the indicator of difference;

g. means for modifying the initial surface profile model to include the at least one optimum value, thereby providing a final model in terms of the at least one input variable; and h. means for generating the respective process value of the at least one input variable from the final model and the desired surface profile.

20. The apparatus of claim 19 wherein the test surface profile comprises a plurality of snapshots, the approximate profile prediction including a frame corresponding to each snapshot, the means for generating an indicator of difference between the test surface profile and the approximate profile prediction being configured so as to compare each snapshot with the respective corresponding frame.

21. The apparatus of claim 19 further comprising a computer memory for storing a respective rough preliminary value of the at least one unknown coefficient, the means for generating an approximate profile description from the initial surface profile model and the respective test value of the at least one input variable employing the respective rough preliminary value.

22. The method of claim 21 wherein the means for generating a respective optimum value of the at least one unknown coefficient is configured to change at least one of said at least one respective rough preliminary value of the at least one unknown coefficient and to compare the test surface profile and the approximate profile prediction incorporating the at least one changed value.

23. The method of claim 19 wherein the means for generating an indicator of difference between the test surface profile and the approximate profile prediction employs a multidimensional nonlinear least-squares technique.

24. An apparatus for predictively calculating a process surface profile to be created on a process substrate by a plasma process sequence defined by a respective process value of at least one input variable, the apparatus comprising:

a. a computer memory for storing the respective process value;

b. a computer memory for storing a test surface profile, the computer memory being created by performing a test process defined by a respective test value of the at least one input variable on a test substrate;

c. means for generating an initial surface profile model in terms of the at least one input variable and at least one unknown coefficient;

d. means for generating an approximate profile prediction from the initial model and the respective test value of the at least one input variable;

e. means for generating an indicator of difference between the test surface profile and the approximate profile prediction;

f. means for generating a respective optimum value of the at least one unknown coefficient that minimizes the indicator of difference;

g. means for modifing the initial surface profile model to include the at least one optimum value, thereby providing a final model in terms of the at least one input variable; and h. means for introducing the respective process value of the at least one input variable into the final model, thereby forming a description of the process surface profile.

25. The apparatus of claim 24 wherein the test surface profile comprises a plurality of snapshots, the approximate profile prediction including a prediction corresponding to each snapshot, the means for generating an indicator of difference between the test surface profile and the approximate profile prediction being configured so as to compare each snapshot with the respective corresponding prediction.

26. The apparatus of claim 24 further comprising a computer memory for storing a respective rough preliminary value of the at least one unknown coefficient, the means for generating an approximate profile prediction employing the respective rough preliminary value.

27. The method of claim 26 wherein the means for generating a respective optimum value of the at least one unknown coefficient is configured to change at least one of said at least one respective rough preliminary value of the at least one unknown coefficient and to compare the test surface profile and the approximate profile prediction incorporating the at least one changed value.

28. The method of claim 24 wherein the means for generating an indicator of difference between the test surface profile and the approximate profile prediction employs a multidimensional nonlinear least-squares technique.

* * * * *